United States Patent
Kim et al.

(10) Patent No.: US 9,780,289 B2
(45) Date of Patent: Oct. 3, 2017

(54) MULTILAYER PIEZOELECTRIC ELEMENT

(71) Applicant: SAMSUNG ELECTRO-MECHANICS CO., LTD., Suwon-Si, Gyeonggi-Do (KR)

(72) Inventors: Boum Seock Kim, Suwon-Si (KR); Hui Sun Park, Seoul (KR); Jung Wook Seo, Hwasung-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 488 days.

(21) Appl. No.: 14/488,127

(22) Filed: Sep. 16, 2014

(65) Prior Publication Data
US 2015/0076967 A1    Mar. 19, 2015

(30) Foreign Application Priority Data
Sep. 17, 2013 (KR) .......................... 10-2013-0112206

(51) Int. Cl.
*H01L 41/083* (2006.01)
*H01L 41/047* (2006.01)

(52) U.S. Cl.
CPC ........ *H01L 41/083* (2013.01); *H01L 41/0471* (2013.01)

(58) Field of Classification Search
CPC ...................................... H01L 41/08
USPC .......................... 310/328, 363–365
See application file for complete search history.

(56) References Cited

U.S. PATENT DOCUMENTS

| | | | | |
|---|---|---|---|---|
| 5,126,618 | A | * 6/1992 | Takahashi | H01L 41/083 310/328 |
| 5,438,232 | A | * 8/1995 | Inoue | H01L 41/083 310/328 |
| 7,042,143 | B2 | * 5/2006 | Bindig | H01L 41/083 310/328 |
| 2003/0222240 | A1 | 12/2003 | Sasaki et al. | |
| 2004/0232805 | A1 | 11/2004 | Ebigase et al. | |
| 2007/0046148 | A1 | * 3/2007 | Sugg | H01L 41/083 310/328 |
| 2014/0319968 | A1 | 10/2014 | Sashida et al. | |

FOREIGN PATENT DOCUMENTS

| | | | |
|---|---|---|---|
| JP | DE 102004006777 A1 | * 9/2004 | ........ H01L 41/0471 |
| JP | 2013-016548 A | 1/2013 | |
| JP | 2013-150305 A | 8/2013 | |

OTHER PUBLICATIONS

Fuda et al., Multilayer Piezoelectric Ceramic Vibrator with Internal Electrodes, Sep. 1995, Jpn. J. Appl. Phys,. vol. 34 (1995) pp. 5270-2572.*
Extended European Search Report EP Application No. 14275087.6 dated Feb. 13, 2015.
In-Ho Im et al., "Multilayer piezoelectric actuator with AgPd internal electrode", Journal of the European Ceramic Society 20 (2000) pp. 1011-1015.

* cited by examiner

*Primary Examiner* — J. San Martin
(74) *Attorney, Agent, or Firm* — McDermott Will & Emery LLP

(57) ABSTRACT

The present disclosure relates to a multilayer piezoelectric element which includes a plurality of piezoelectric layers with a thickness of 15 μm to 100 μm each; and internal electrodes interposed between the plurality of piezoelectric layers and laminated to alternately form an anode and a cathode.

26 Claims, 4 Drawing Sheets

MULTILAYER PIEZOELECTRIC ELEMENT

CROSS-REFERENCE TO RELATED APPLICATIONS

This application claims the benefit under 35 U.S.C. Section 119 of Korean Patent Application Serial No. 10-2013-0112206, filed Sep. 17, 2013, which is hereby incorporated herein by reference in its entirety.

TECHNICAL FIELD

The present disclosure relates to a multilayer piezoelectric element.

BACKGROUND

Recently, multifunctional and high-end portable electronic devices have been developed according to the development of multimedia devices and the convergence of electronic devices. These portable devices have a haptic piezoelectric element for implementing a sense of touch by a vibration force among various functions and use the haptic piezoelectric element as a means of providing a three-dimensional touch to users when driving various applications such as games or text input.

Currently, mobile devices including smartphones mostly execute text input and applications using a touch screen. In the past, a method of implementing a haptic function by driving a vibration motor embedded in a mobile device with a driving voltage generated by a current applied when touching a touch screen was mainly used, but the touch screen has been rapidly replaced by the piezoelectric element in the recent high-end mobile devices since the touch screen has a low reaction speed compared to low cost.

The piezoelectric element is operated by the electric field formed between two electrodes, that is, an anode and a cathode by applying a voltage to a piezoelectric material, causes the deformation of structure by the dipole generated inside the piezoelectric material through the movement of the electric field, and generates vibration by the mechanical displacement in the longitudinal or cross-sectional direction through the structural deformation.

The piezoelectric element can realize an immediate haptic function since the reaction speed of the piezoelectric element is several times faster than the conventional vibration motor in converting an electrical signal to mechanical displacement.

However, since a desired type of vibration force is implemented when various types of module structures are accompanied to adjust the mechanical displacement of the piezoelectric element and the piezoelectric material constituting the piezoelectric element requires a high operating voltage, it is difficult to implement a high vibration force under a limited operating voltage of the mobile device.

Therefore, currently, there exists a need for developing a piezoelectric element for implementing a high vibration force while reducing the overall operating voltage.

Patent Document 1: Japanese Patent Laid-Open Publication No. 2013-016548

SUMMARY

The present disclosure has been developed in order to overcome the various disadvantages and problems raised in the conventional multilayer piezoelectric element and it is, therefore, an object of the subject technology to provide a multilayer piezoelectric element that can satisfy relative displacement characteristics and reliability at the same time by adjusting the thickness of a piezoelectric layer.

Further, it is another object of the present disclosure to provide a multilayer piezoelectric element that can satisfy relative displacement characteristics and reliability at the same time by adjusting the size of grains distributed in the cross-sectional direction of a piezoelectric layer when adjusting the thickness of the piezoelectric layer of a piezoelectric element.

In accordance with one aspect of the present disclosure to achieve the object, there is provided a multilayer piezoelectric element including: a plurality of piezoelectric layers; and internal electrodes interposed between the plurality of piezoelectric layers and laminated to alternately form an anode and a cathode, wherein the piezoelectric layer has a thickness of about 15 μm to about 100 μm.

In an embodiment, a ratio of a sum of thicknesses of the internal electrodes to the entire thickness of the piezoelectric element is less than about 12%.

In another embodiment, a non-piezoelectric interfacial layer is formed on an interface between the plurality of piezoelectric layers and the internal electrodes, the internal electrode and the non-piezoelectric interfacial layer may be formed as an inactive layer, and a ratio of a thickness of the inactive layer to the entire thickness of the multilayer piezoelectric element is less than about 12% when a sum of the thicknesses of the internal electrodes and the non-piezoelectric interfacial layers is the thickness of the inactive layer.

Further, when a ratio of the inactive layer is the ratio of the thickness of the inactive layer to the entire thickness of the multilayer piezoelectric element, the ratio of the inactive layer is determined by the following Equation:

Ratio of inactive layer=((thickness of internal electrode+thickness of non-piezoelectric interfacial layer)×number of layers)/entire thickness ($T$) of piezoelectric element.    Equation In another embodiment, the entire thickness of the multilayer piezoelectric element is less than about 1.5 mm, and the number of layers of the plurality of piezoelectric layers is about 3 to about 100.

In another embodiment, a grain size of the piezoelectric layer is formed to have a charge moving path that satisfies about 90% or more of relative displacement characteristics of the piezoelectric layer when a grain boundary length is increased, and the grain size satisfies or is determined by the following Equation:

$$\frac{Gmax}{\sqrt{t}} \leq 0.51 \qquad \text{Equation}$$

where Gmax is a major axis length of the largest grain of the grains positioned on a vertical line H of a cross-section obtained by cutting the piezoelectric layer in a vertical direction, and t is the thickness of the piezoelectric layer.

In one embodiment, the major axis length Gmax of the grain is about 1 μm to about 2 μm.

Meanwhile, in accordance with another aspect of the present disclosure to achieve the object, there is provided a multilayer piezoelectric element including: a plurality of piezoelectric layers; and internal electrodes interposed between the plurality of piezoelectric layers and laminated to alternately form an anode and a cathode, wherein the piezoelectric layer has a thickness of about 15 μm to about 100 µm, and a major axis length of the largest grain of the grains constituting the piezoelectric layer in the piezoelectric layer is about 1 µm to about 2 µm, wherein relative displacement characteristics within the range of the thickness of the piezoelectric layer satisfies about 95% or more compared to displacement characteristics of a standard multilayer piezoelectric element, and the relative displacement characteristics within the range of a grain size of the piezoelectric layer satisfies about 90% or more compared to the displacement characteristics of the standard multilayer piezoelectric element.

In one embodiment, the grain size satisfies or is determined by the following Equation:

$$\frac{Gmax}{\sqrt{t}} \leq 0.51 \qquad \text{Equation}$$

where Gmax is the major axis length of the largest grain of the grains positioned on a vertical line H of a cross-section obtained by cutting the piezoelectric layer in a vertical direction, and t is the thickness of the piezoelectric layer.

Further, in some embodiments, a ratio of a sum of thicknesses of the internal electrodes to the entire thickness of the piezoelectric element is less than about 12%, and a sum of thicknesses of inactive layers, which is a sum of the thicknesses of the internal electrodes and thicknesses of non-piezoelectric interfacial layers, to the entire thickness of the piezoelectric element is less than about 12%.

When a ratio of the inactive layer is a ratio of the thickness of the inactive layer to the entire thickness of the multilayer piezoelectric element, the ratio of the inactive layer is determined by the following Equation:

Ratio of inactive layer=((thickness of internal electrode+thickness of non-piezoelectric interfacial layer)×number of layers)/entire thickness (T) of piezoelectric element. Equation In another embodiment of the present disclosure, a multilayer piezoelectric element comprises a plurality of piezoelectric layers and internal electrodes interposed between the plurality of piezoelectric layers and laminated to alternately form an anode and a cathode. The internal electrodes comprise an Ag/Pd alloy. The internal electrodes may include a non-piezoelectric interfacial layer formed on opposing main surfaces of the internal electrodes. The non-piezoelectric interfacial layer may be a reaction product of the Ag/Pd alloy of the internal electrodes and ceramic material of the piezoelectric layer. In certain embodiments, the interfacial layer comprises PdPbO, PdO, Ag/Pd—Pb, or Ag-PZT.

In certain embodiments, the grain size of the piezoelectric layer is formed to have a charge moving path that satisfies 95% or more of relative displacement characteristics of the piezoelectric layer when compared to the displacement characteristics of a standard multilayer piezoelectric element with a piezoelectric layer thickness of 1 mm.

In certain embodiments, a ratio of a sum of thicknesses of the internal electrodes to the entire thickness of the piezoelectric element ranges from 2% to less than 12%.

BRIEF DESCRIPTION OF THE DRAWINGS

These and/or other aspects and advantages of the present general inventive concept will become apparent and more readily appreciated from the following description of the embodiments, taken in conjunction with the accompanying drawings.

FIG. 3A shows a single-layered piezoelectric element; FIG. 3B shows a multilayer piezoelectric element.

FIGS. 4A and 4B are comparative schematic diagrams of a thickness of a piezoelectric layer according to adjustment of the number of layers of the multilayer piezoelectric element in accordance with the present disclosure. FIG. 4A shows a multilayer piezoelectric element with a piezoelectric layer thickness of 85 µm; FIG. 4B shows another multilayer piezoelectric element with a piezoelectric layer thickness of 4 µm.

FIG. 6A shows a piezoelectric layer with a thickness of 30 µm; FIG. 6B shows a piezoelectric layer with a thickness of 5 µm.

DETAILED DESCRIPTION

A matter regarding to an operation effect including a technical configuration for an object of a multilayer piezoelectric element in accordance with the present disclosure to achieve the object will be clearly appreciated through the following detailed description with reference to the accompanying drawings illustrating exemplary embodiments of the present disclosure.

Figure 1:
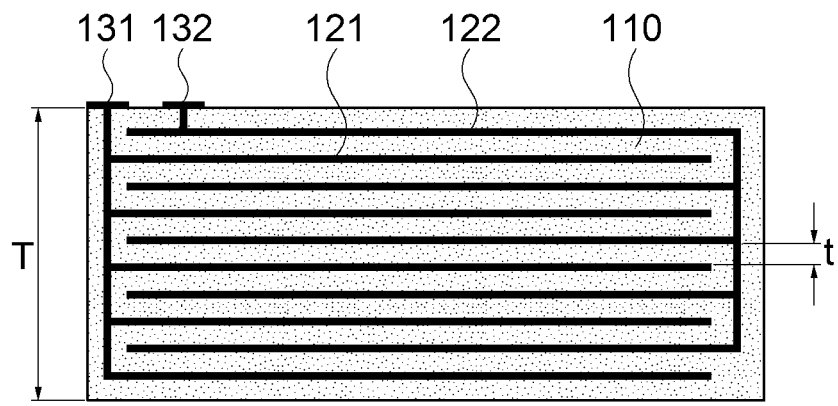
FIG. 1 is a cross-sectional view of a multilayer piezoelectric element applied to an embodiment in accordance with the present disclosure.
Figure 2:
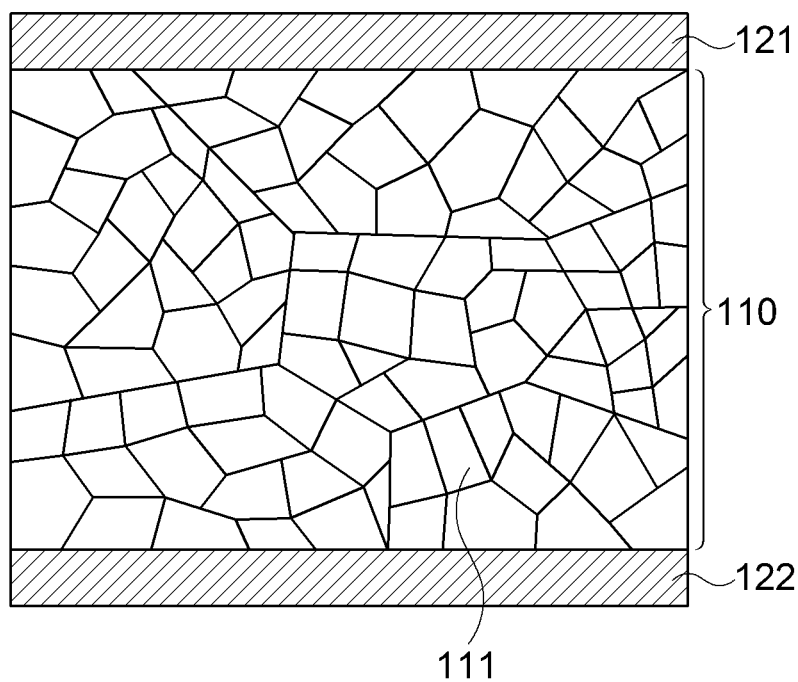
FIG. 2 is a partial enlarged cross-sectional view of the piezoelectric element of FIG. 1.

First, FIG. 1 is a cross-sectional view of a multilayer piezoelectric element in accordance with an embodiment of the present disclosure, and FIG. 2 is a partial enlarged cross-sectional view of the piezoelectric element of FIG. 1.

As shown, a multilayer piezoelectric element 100 according to the present disclosure consists of a laminate formed by laminating a plurality of piezoelectric layers 110, and internal electrodes 121 and 122 are laminated on the plurality of piezoelectric layers 110 so that the plurality of piezoelectric layers 110 and the internal electrodes 121 and 122 are alternately disposed. In one embodiment, as for the internal electrodes 121 and 122, the anode internal electrode 121 and the cathode internal electrode 122 are alternately disposed on the plurality of piezoelectric layers 110.

The plurality of piezoelectric layers 110 may be made of a ceramic material and prepared in the form of a plate ceramic sheet using fine ceramic powder. Each piezoelectric layer 110 formed of a ceramic sheet may be formed of a sintered ceramic sheet obtained by applying ceramic powder in a slurry state mixed with a binder, etc. in a plate shape using a dot blade method, etc. and sintering the slurry through a firing process of predetermined temperature and time. In some embodiments, the sintered ceramic sheet has a cross-sectional shape in which irregular grains 111 are connected to each other while forming a boundary therebetween.

Each piezoelectric layer 110 is formed by laminating a plurality of sintered ceramic sheets prepared like this, and the piezoelectric layers 110 form a laminate to generate displacement in the longitudinal or cross-sectional direction by the application of a voltage. At this time, the voltage applied to the laminate formed by laminating the piezoelectric layers 110 is applied through the internal electrodes 121 and 122 disposed on the piezoelectric layers 110.

The internal electrodes 121 and 122 are made of a metal material having good conductivity and mainly made of Ag/Pd alloy metal materials. Further, the internal electrodes 121 and 122 may be formed on the ceramic sheets constituting the piezoelectric layers 110 by a screen printing method, etc. These internal electrodes 121 and 122 form an anode and a cathode, respectively, in the laminate formed by laminating the plurality of piezoelectric layers 110 and are repeatedly laminated alternately with the piezoelectric layers 110 to constitute the piezoelectric element having a polarity.

Further, the internal electrodes 121 and 122 disposed between the piezoelectric layers 110 alternately form an anode and a cathode, and the internal electrodes 121 and 122 having the same polarity are electrically connected to each other. The internal electrodes 121 and 122 of the respective polarities are electrically connected to an anode terminal 131 and a cathode terminal 132 through lead wires.

In some embodiments, the piezoelectric layers having no internal electrodes thereon may be additionally laminated on the uppermost layer and the lowermost layer to protect the exposed internal electrodes 121 and 122 when laminating the piezoelectric layers 110. And the multilayer piezoelectric element may be manufactured by coating an insulating material (not shown in the drawing) on the outer peripheral surface of the piezoelectric element except the anode terminal 131 and the cathode terminal 132 exposed to the outside to protect the element from moisture and external environment.

When the multilayer piezoelectric element 100 of the present disclosure configured as above configures a haptic piezoelectric element, it is preferred that the entire thickness T of the piezoelectric element is about 100 µm to about 1.5 mm and the number of layers of the piezoelectric layers 110 is about 3 to about 100. The performance of the multilayer piezoelectric element 100 is determined by the thickness t of the piezoelectric layer determined by adjusting the number of layers of the piezoelectric layers 110 within the range of the entire thickness T of the piezoelectric element.

Here, the number of layers of the piezoelectric layers 110 within the range of the entire thickness T of the piezoelectric element is defined as the number of layers of the piezoelectric layers except the piezoelectric layers of the uppermost layer and the lowermost layer, which are additionally laminated to protect the internal electrodes 121 and 122 exposed to the uppermost layer and the lowermost layer when laminating the piezoelectric layers 110.

More specifically, since the multilayer piezoelectric element 100 of the present disclosure is mounted to portable devices such as a smartphone or a tablet PC by mainly constituting a piezoelectric actuator for driving a vibration motor or a camera, the entire thickness T of the multilayer piezoelectric element 100 is limited within a maximum of about 1.5 mm according to the trend of slimming of the portable devices and it is preferred that the multilayer piezoelectric element 100 is designed to maximize a vibration force by improving relative displacement characteristics within a limited thickness and allow the thickness t of the piezoelectric layer to satisfy reliability while maintaining the relative displacement characteristics.

Here, a criterion for the reliability for the thickness t of the piezoelectric layer is that an interlayer short does not occur and a good state is maintained when repeating $10^6$ cycles for the multilayer piezoelectric element 100 of the present disclosure on the assumption that one cycle is that the time for which a voltage is applied to the piezoelectric element consisting of the plurality of piezoelectric layers 110 and the internal electrodes 121 and 122 is 0.5 seconds and the time for which the voltage is not applied to the piezoelectric element is 0.5 seconds.

Like this, it is possible to improve the displacement characteristics for the improvement of the vibration force within a limited thickness of the multilayer piezoelectric element 100 by setting a driving voltage high.

That is, the higher the driving voltage applied through the anode terminal 131 and the cathode terminal 132, the greater the displacement of the multilayer piezoelectric element 100, but since the voltage applied to the piezoelectric element should be usually limited to less than 200 V due to the characteristics of the portable devices, it is not possible to obtain the desired displacement characteristics only by setting the driving voltage high.

At this time, the reason why the voltage applied to the multilayer piezoelectric element 100 should be limited is because the voltage can be amplified up to several kV through a drive IC but the piezoelectric element and the portable device cannot operate at a voltage higher than a reference (typically, 220 V to 250 V).

Further, in order to improve the displacement characteristics in a state in which the driving voltage applied to the multilayer piezoelectric element 100 is limited to less than 200 V, it is preferred to maintain the relative displacement characteristics at about 95% or more compared to a standard multilayer piezoelectric element by adjusting the thickness of the plurality of piezoelectric layers 110.

The plurality of piezoelectric layers 110 of the multilayer piezoelectric element 100 can have high displacement characteristics even at a low driving voltage if the thickness t of the piezoelectric layers 110 is small. Therefore, it is possible to improve the displacement characteristics within a limited driving voltage range of less than 200 V by increasing the number of layers of the piezoelectric layers 110 to reduce the thickness t of the piezoelectric layer in a state in which the entire thickness T of the multilayer piezoelectric element 100 is the same.

Figure 3A:
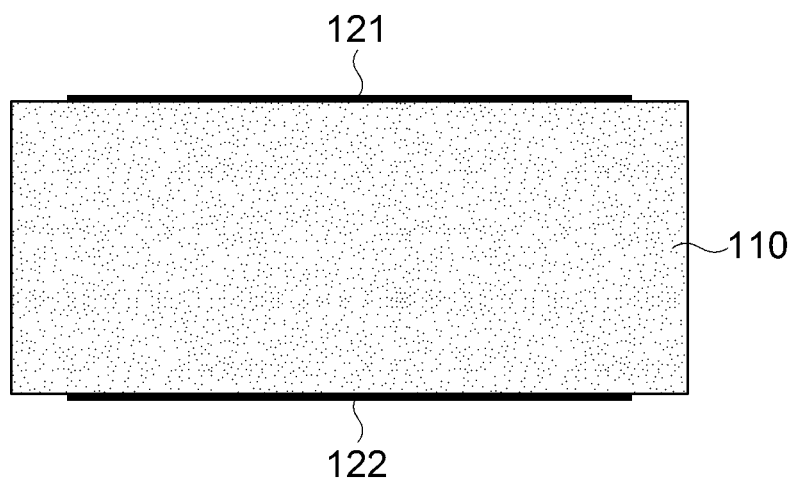
FIGS. 3A and 3B are schematic diagrams of a multilayer piezoelectric element for comparing displacement characteristics with a single-layered piezoelectric element when the same driving voltage is applied.
Figure 3B:
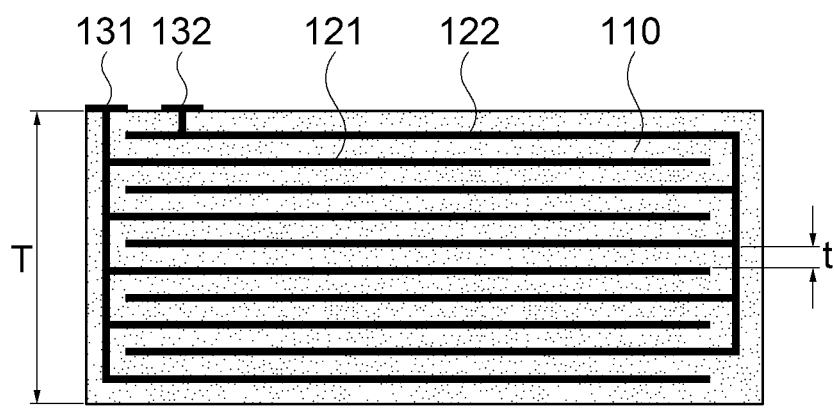

Specifically describing the principle about this by taking a comparative view of a single-layered piezoelectric element and a multilayer piezoelectric element shown in FIGS. 3A and 3B as an example, it is possible to understand the relationship of the displacement characteristics according to the thickness t of the piezoelectric layer and the applied voltage when the single-layered piezoelectric element (FIG. 3A) and the multilayer piezoelectric element (FIG. 3B) have the same entire thickness T as shown.

That is, there may be nine times the difference between electric fields V/T actually applied to the single-layered piezoelectric element in FIG. 3A and the nine-layered multilayer piezoelectric element in FIG. 3B according to the thickness t of the piezoelectric layer.

When the same driving voltage is applied to the two piezoelectric elements (FIGS. 3A and 3B), the multilayer piezoelectric element (FIG. 3B) may have a displacement nine times greater than the single-layered piezoelectric element (FIG. 3A), and a voltage nine times lower than the single-layered piezoelectric element (FIG. 3B) may be applied to the multilayer piezoelectric element (FIG. 3B) when implementing the same displacement.

Therefore, it will be understood that the displacement characteristics is improved by increasing the number of layers of the piezoelectric layers 110 to decrease the thickness t of the piezoelectric layer when the entire thickness T of the multilayer piezoelectric element 100 is the same as the single-layered piezoelectric element (FIG. 3A).

Here, FIGS. 3A and 3B are schematic diagrams of the multilayer piezoelectric element for comparing the displacement characteristics with the single-layered piezoelectric element when the same driving voltage is applied.

Figure 4A:
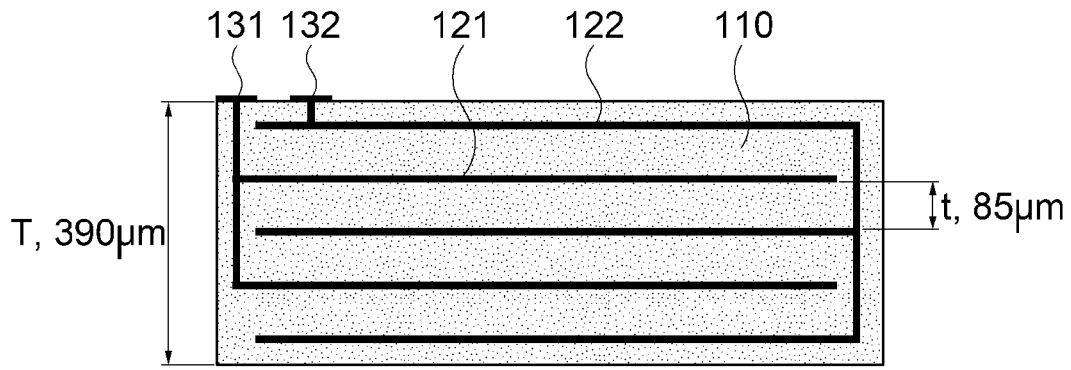
Figure 5:
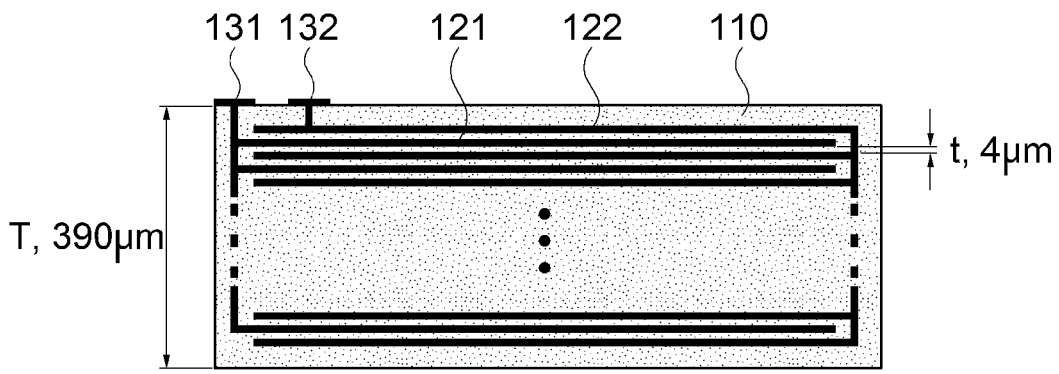
FIG. 5 is an interlayer enlarged cross-sectional view of the multilayer piezoelectric element in accordance with the present disclosure.
Figure 5:
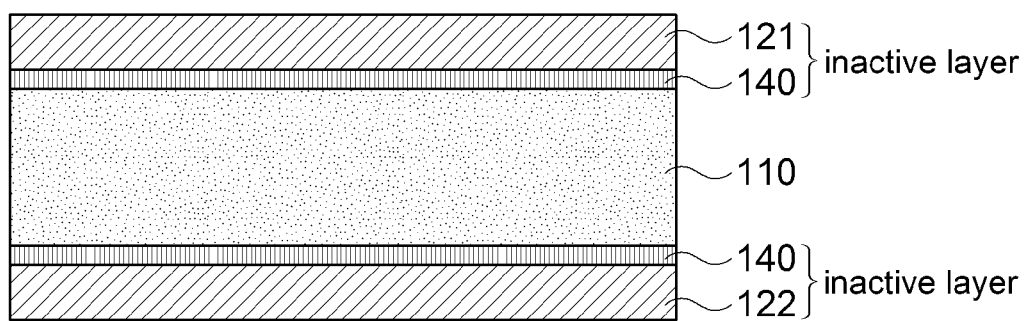

Meanwhile, FIGS. 4A and 4B are comparative schematic diagrams of the thickness of the piezoelectric layer according to the adjustment of the number of layers of the multilayer piezoelectric element in accordance with the present disclosure, and FIG. 5 is an interlayer enlarged cross-sectional view of the multilayer piezoelectric element in accordance with the present disclosure.

As shown, the multilayer piezoelectric element 100 of the present disclosure consists of a laminate consisting of the plurality of piezoelectric layers 110 and the anode and cathode internal electrodes 121 and 122 alternately laminated between the piezoelectric layers 110. As described above, the displacement characteristics of the multilayer piezoelectric element 100 is improved by reducing the thickness t of the piezoelectric layer 110 through the adjustment of the number of layers when the entire thickness T is the same. Here, since the configuration except the piezoelectric layer 110 and the internal electrodes 121 and 122 of the multilayer piezoelectric element 100 was described in detail above with reference to FIG. 1, repeated descriptions will be omitted.

Referring to FIGS. 4A, 4B and 5, when the entire thickness T of the multilayer piezoelectric element 100 is kept the same, the range of the thickness t of the piezoelectric layer is determined by the ratio according to the sum of the piezoelectric layers 110 having piezoelectric properties and the internal electrodes 121 and 122 having non-piezoelectric properties.

As for the relationship of the displacement characteristics according to the ratio of the internal electrodes acting as a variable for limiting the range of the thickness t of the piezoelectric layer, when the multilayer piezoelectric elements of FIGS. 4A and 4B have the same entire thickness T of 390 μm, since the number of layers of the internal electrodes 121 and 122 increases proportionally to the number of layers of the piezoelectric layers 110, the ratio of the total thickness of the internal electrodes 121 and 122 having non-electrical properties to the entire thickness T of the piezoelectric element increases, thus deteriorating the displacement characteristics of the piezoelectric element.

When the four-layered multilayer piezoelectric element (FIG. 4A) and the eighty-layered multilayer piezoelectric element (FIG. 4B) as shown, have the same entire thickness T (390 μm), the thickness t of the piezoelectric layers may be 85 μm and 4 μm, respectively, and voltages of 75 V and 3.5 V may be respectively applied according to the thickness t of the piezoelectric layers to drive the four-layered multilayer piezoelectric element and the eighty-layered multilayer piezoelectric element with the same displacement.

In the four-layered multilayer piezoelectric element of FIG. 4A, the number of layers of the internal electrodes 121 and 122 is 5 and thus the sum of the thickness of the internal electrodes in the piezoelectric element is 10 μm, and the ratio of the sum of the thickness of the internal electrodes 121 and 122 having non-piezoelectric properties to the entire thickness T of the piezoelectric element is 2.6% (10 μm/390 μm). In this case, it is assumed that the internal electrodes 121 and 122 are formed on the piezoelectric layers 110 as a typical thick film to have a thickness of 2 μm.

Further, in the eighty-layered multilayer piezoelectric element of FIG. 4B, the number of layers of the internal electrodes 121 and 122 is 81 and thus the sum of the thickness of the internal electrodes in the piezoelectric element is 162 μm, and the ratio of the sum of the thickness of the internal electrodes 121 and 122 having non-piezoelectric properties to the entire thickness T of the piezoelectric element is 41.5% (162 μm/390 μm).

When comparing them, in case that the thickness t of the piezoelectric layer constituting the multilayer piezoelectric element 100 is reduced from 85 μm to 4 μm, the number of layers is increased in the same electrical field and thus the driving voltage of the piezoelectric element is reduced from 70 V to 3.5 V, but the ratio of the sum of the thickness of the internal electrodes 121 and 122 having non-piezoelectric properties is increased from less than 3% to greater than 41% and the ratio of the piezoelectric layer 110 having piezoelectric properties in the piezoelectric element is reduced. Thus, it is difficult to expect the desired displacement characteristics.

Looking into the simulation results of the multilayer piezoelectric element 100 according to the present disclosure with reference to the following Table 1, since it can be understood that the relative displacement of the piezoelectric element is reduced to less than 95% from the point when the ratio of the sum of the internal electrodes 121 and 122 having non-electrical properties in the multilayer piezoelectric element 100 exceeds 12%, it is preferred to adjust the thickness t of the piezoelectric layer so that the ratio of the sum of the thickness of the internal electrodes 121 and 122 to the entire thickness T of the piezoelectric element is maintained at less than 12%.

Meanwhile, in the multilayer piezoelectric element 100 of the present disclosure, as shown in FIG. 5, since the internal electrodes 121 and 122 interposed between the piezoelectric layers 110 are mainly made of Ag/Pd alloy metal materials, a non-piezoelectric interfacial layer 140 having non-piezoelectric properties may be generated by the chemical reaction on the interface between the internal electrodes 121 and 122 and the piezoelectric layers 110.

Therefore, since the ratio of the inactive layer consisting of the non-piezoelectric interfacial layer 140 and the internal electrodes 121 and 122 is rapidly increased according to the decrease in the thickness of the piezoelectric layer 110 and the increase in the number of layers of the piezoelectric layers 110 as in FIG. 4B, the relative displacement characteristics may be significantly deteriorated.

Here, the non-piezoelectric interfacial layer 140 may be formed with a thickness of maximum 2 μm on both surfaces of the non-piezoelectric internal electrodes 121 and 122 having a significantly low piezoelectric constant by the interfacial reaction between the Ag/Pd alloy metal material of the internal electrodes 121 and 122 and the ceramic material of the piezoelectric layer 110 during the operation of the multilayer piezoelectric element 100. The non-piezoelectric interfacial layer 140 may be mainly made of materials such as PdPbO, PdO, Ag/Pd—Pb, and Ag-PZT.

In this situation, the ratio of the inactive layer by the sum of the thickness of the internal electrodes 121 and 122 and the non-piezoelectric interfacial layer 140 to the entire thickness T of the multilayer piezoelectric element 100 is calculated by the following Equation 1.

In the following Equation 1, the ratio of the inactive layer is the ratio of the thickness of the inactive layer to the entire thickness of the multilayer piezoelectric element.

Ratio of inactive layer=((thickness of internal electrode+thickness of non-piezoelectric interfacial layer)×number of layers)/entire thickness (T) of piezoelectric element  [Equation 1]

When calculating the ratio of the inactive layer of the multilayer piezoelectric element 100 of the present disclosure using the above Equation 1, the thickness t of the piezoelectric layer having the relative displacement characteristics as in the following Table 1 can be limited and the number of layers of the piezoelectric layers 110 can be designed by considering the entire thickness T of the multilayer piezoelectric element within the range of the thickness t of the piezoelectric layer.

TABLE 1

| Thickness (t) of piezoelectric layer | Relative displacement* | Ratio of inactive layer | Driving voltage | Reliability |
|---|---|---|---|---|
| 3 μm | 55% | 40% | 6 V | X |
| 5 μm | 75% | 29% | 10 V | X |
| 10 μm | 90% | 17% | 20 V | X |
| 15 μm | 95% | 12% | 30 V | ○ |
| 40 μm | 96% | 5% | 80 V | ○ |
| 60 μm | 98% | 3% | 120 V | ○ |
| 100 μm | 99% | 2% | 200 V | ○ |
| 150 μm | 100% | 1% | 300 V | ○ |
| 300 μm | 100% | 0.7% | 600 V | ○ |
| 800 μm | 100% | 0.2% | 1.6 KV | ○ |

*The relative displacement in Table 1 means the relative displacement according to the thickness of the piezoelectric layer of the multilayer piezoelectric element of the present disclosure when the displacement of the standard multilayer piezoelectric element is 100%, in which the thickness of the piezoelectric layer 110 is 1 mm and the major axis length Gmax of the grain is 2 μm.

The piezoelectric performance of the multilayer piezoelectric element 100 of the present disclosure can be implemented when the ratio of the total thickness of the inactive layer including the internal electrodes 121 and 122 and the non-piezoelectric interfacial layers 140 to the entire thickness T of the piezoelectric element is maintained at less than about 12% and the relative displacement of the piezoelectric element is maintained at about 95% or more.

As shown in Table 1, it can be understood that the multilayer piezoelectric element 100 having the entire thickness T of 100 μm to 1.5 mm exhibits the relative displacement of 95% or more compared to the standard multilayer piezoelectric element when the thickness t of the piezoelectric layer is 15 μm to 100 μm. When the thickness t of the piezoelectric layer is greater than 100 μm, the condition of the ratio of the inactive layer to the entire thickness of the piezoelectric element and the condition of the relative displacement can be sufficiently satisfied, but since a higher driving voltage should be applied according to the increase in the thickness t of the piezoelectric layer to implement the same displacement as described above, the driving voltage applied to the multilayer piezoelectric element 100 is increased to greater than 200 V. Since the driving voltage of greater than 200 V gives a burden to the piezoelectric element or the electronic device, it is not suitable as the applied voltage. And, when the thickness t of the piezoelectric layer is less than 15 μm, it is advantageous in that a relatively low voltage can be applied, but it is not possible to satisfy the above-described reliability since driving performance is remarkably deteriorated due to the high ratio of the inactive layer to the entire thickness T of the piezoelectric element and a short due to the interlayer electric field movement which may occur due to the too small thickness t of the piezoelectric layer.

Meanwhile, in the multilayer piezoelectric element 100 of the present disclosure, since the ratio of the inactive layer to the entire thickness T of the piezoelectric element is less than about 12%, even though the thickness t of the piezoelectric layer satisfies the range of 15 μm to 100 μm, the boundary of the grains may be shortened according to the size of the grains constituting the piezoelectric layer 110 according to the thickness t of the piezoelectric layer and a short due to the conduction between the internal electrodes 121 and 122 may occur by the electric field moving along the shortened grain boundary, thus causing the problem of reliability.

Figure 6A:
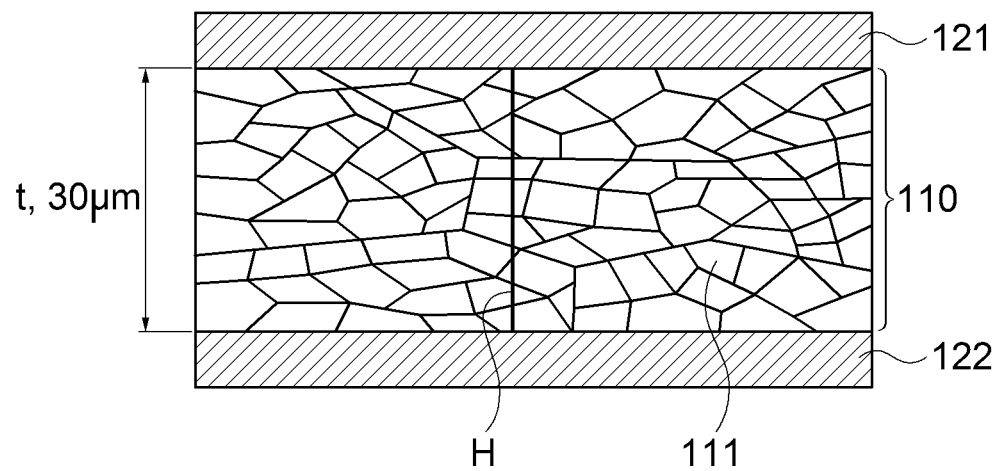
FIGS. 6A and 6B are cross-sectional views of the piezoelectric layer according to the thickness of the piezoelectric layer in the multilayer piezoelectric element of the present disclosure.
Figure 6B:
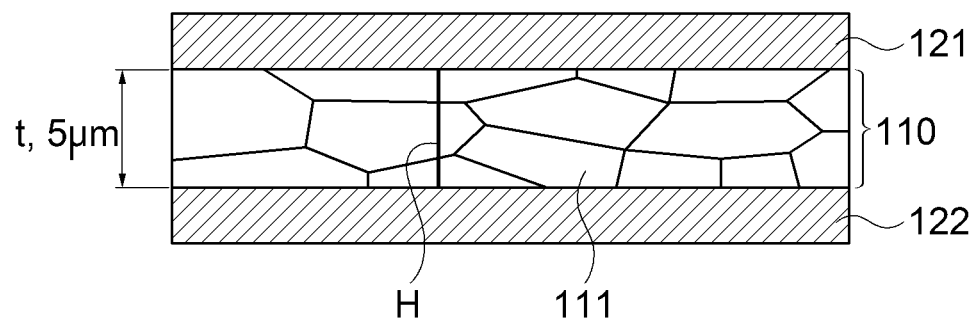

Here, FIGS. 6A and 6B are cross-sectional views of the piezoelectric layer according to the thickness of the piezoelectric layer in the multilayer piezoelectric element of the present disclosure. FIGS. 6A and 6B are enlarged views of the cross-section of the piezoelectric layers 110 when the thickness t of the piezoelectric layers is 30 μm (FIG. 6A) and 5 μm (FIG. 6B). As shown in these figures, in the multilayer piezoelectric element 100 of the present disclosure, it can be understood that a short occurs between a pair of internal electrodes 121 and 122 since the number of the grains 111 is reduced according to the decrease in the thickness t of the piezoelectric layer when the size of the grains is similar (considering that the shape of the grains is irregular) and a moving path of Ag+ ions separated from the internal electrodes 121 and 122 made of Ag/Pd alloy metal materials along the boundary of the grains 111 is shortened when the number of the grains is small. That is, in FIG. 6A, the probability of occurrence of the short between the internal electrodes 121 and 122 is low, and in FIG. 6B, the possibility of occurrence of the short between the internal electrodes 121 and 122 is high. Therefore, it is preferred to increase a moving path of charges in an electric field by reducing the size of the grains 111 according to the decrease in the thickness t of the piezoelectric layer of the multilayer piezoelectric element 100 and increasing the number of the grains adjacent to each other within the small thickness t of the piezoelectric layer to increase the boundary of the connected grains.

The boundary length of the grains may mean a moving distance of charges when the charges (Ag+) move along the grain boundary inside the piezoelectric layer from one internal electrode to the other internal electrode in the pair of internal electrodes, which form an anode and a cathode, and the piezoelectric layer between the internal electrodes, and the boundary length of the grains may be adjusted long or short according to the size of the grains in the piezoelectric layer.

At this time, the size of the grains 111 may be defined based on the major axis length Gmax of the largest grain of the grains positioned on a vertical line H, vertical to the internal electrodes 121 and 122 laminated on upper and lower surfaces of the piezoelectric layer 110, in the cross-section of the individual piezoelectric layer 110. In the multilayer piezoelectric element 100 of the present disclosure, it may be needed to form the piezoelectric layer 110 by adjusting the major axis length Gmax of the grains according to the thickness t of the piezoelectric layer that satisfies the relative displacement characteristics of Table 1.

Since the piezoelectric layer 110 is formed by applying a slurry formed by mixing ceramic power with a binder, etc. in the form of a sheet, in order to adjust the size of the grains, the size of the grains may be increased or reduced according to the degree of grain refining in the step of preparing the ceramic powder.

Further, even though the fine grain size of the ceramic power is the same, the grain size may be reduced or increased by adjusting firing temperature and firing time for sintering in a state in which the slurry is applied in the form of a sheet. That is, the finer the ceramic power, the smaller the grain size, and the lower the firing temperature and the shorter the firing time of the ceramic sheet, the smaller the grain size.

The following Table 2 is made by simulating the range of the major axis length Gmax of the grain that satisfies the relative displacement characteristics and the reliability according to the thickness t of each piezoelectric layer in the range of the thickness t of the piezoelectric layer of the piezoelectric element that satisfies the conditions of the relative displacement characteristics and the driving voltage of Table 1 in the multilayer piezoelectric element 100 of the present disclosure.

TABLE 2

| Thickness (t) of piezoelectric layer | Gmax (μm) | Gmax/ root (t) | Relative displacement** | Reliability |
|---|---|---|---|---|
| 15 μm | 0.5 | 0.13 | 70% | ○ |
|  | 0.8 | 0.21 | 85% | ○ |
|  | 1 | 0.26 | 95% | ○ |
|  | 2 | 0.51 | 96% | ○ |
|  | 2.2 | 0.57 | 97% | X |
|  | 3 | 0.77 | 98% | X |
| 40 μm | 0.8 | 0.13 | 86% | ○ |
|  | 1 | 0.16 | 95% | ○ |
|  | 3 | 0.47 | 98% | ○ |
|  | 3.5 | 0.55 | 98% | X |
|  | 4 | 0.63 | 99% | X |
| 60 μm | 0.8 | 0.10 | 88% | ○ |
|  | 1 | 0.13 | 95% | ○ |
|  | 3 | 0.39 | 98% | ○ |
|  | 4 | 0.51 | 99% | ○ |
| 100 μm | 0.8 | 0.08 | 89% | ○ |
|  | 1 | 0.10 | 95% | ○ |
|  | 3 | 0.30 | 98% | ○ |
|  | 4 | 0.40 | 99% | ○ |

**The relative displacement in Table 2 means the relative displacement according to the thickness of the piezoelectric layer of the multilayer piezoelectric element of the present disclosure when the displacement of the standard multilayer piezoelectric element is 100%, in which the thickness of the piezoelectric layer 110 is 1 mm and the major axis length Gmax of the grain is 2 μm.

When describing what is listed in Table 2 with reference to Table 1, even though there is an advantage of reducing the driving voltage by reducing the thickness t of the piezoelectric layer of the multilayer piezoelectric element 100 to less than 15 μm as listed in Table 1, as the size of the grain according to the previously defined major axis length Gmax of the grain is increased compared to the thickness t of the piezoelectric layer and the grain boundary length is shortened, a short between the internal electrodes 121 and 122 occurs due to the reduction in the moving path of charges and thus it may be difficult to satisfy the reliability.

Meanwhile, even though the thickness t of the piezoelectric layer listed in Table 2 satisfies the range of 15 μm to 100 μm, if the previously defined major axis length of the grain in the thickness t of each piezoelectric layer is less than 1 μm, the performance of the multilayer piezoelectric element 100 is remarkably deteriorated since the relative displacement of less than 90% with respect to the standard multilayer piezoelectric element is implemented.

Further, when the major axis length Gmax of the grain compared to the thickness t of the piezoelectric layer that satisfies the range of 15 μm to 100 μm is outside the terms of the following Equation 2, the relative displacement of greater than 90% may be satisfied, but since the ratio Gmax/root (t) of the major axis length Gmax of the grain to the thickness t of the piezoelectric layer may be increased, the moving distance of Ag+ along the boundary of the grains 111 may be shortened to cause a short and it is not possible to satisfy the reliability of the piezoelectric layer 110.

$$\frac{Gmax}{\sqrt{t}} \leq 0.51 \qquad \text{[Equation 2]}$$

Thus, based on the information provided in Table 2, when the range of the thickness t of the piezoelectric layer in the multilayer piezoelectric layer 100 of the present disclosure is 15 μm to 100 μm, it is possible to satisfy the relative displacement characteristics and the reliability at the same time within the range of the thickness t of the piezoelectric layer by forming the major axis length Gmax of the largest grain of the grains disposed on an arbitrary vertical line H in the cross-section cut in the vertical direction of the piezoelectric layer 110 with a size of 1 μm to 2 μm.

Further, preferably, it can be understood that the major axis length Gmax of the grain is formed with a size of 1 μm to 3 μm to satisfy the relative displacement characteristics and the reliability at the same time when the thickness t of the piezoelectric layer is 40 μm and the major axis length Gmax of the grain is formed with the size of 1 μm to 4 μm to satisfy the relative displacement characteristics and the reliability at the same time when the thickness t of the piezoelectric layer is 60 μm to 100 μm.

The multilayer piezoelectric element 100 of the present disclosure is needed to satisfy the relative displacement characteristics and the reliability for occurrence of a short of the individual piezoelectric layer 110 by adjusting the size Gmax of the grain in the range (15 μm to 100 μm) of the thickness t of the piezoelectric layer.

For this, as a result of simulating the relative displacement characteristics and the reliability after forming the piezoelectric layer 110 with a thickness of 15 μm to 100 μm by adjusting the number of the grains according to the size of the grains, it can be understood that the piezoelectric performance of the piezoelectric layer 110 is satisfied only when the relative displacement of greater than 90% compared to the displacement of the thickness t of the piezoelectric layer of the standard multilayer piezoelectric element having the entire thickness T of 1 mm is maintained.

Therefore, in the piezoelectric element 100 of the present disclosure, if the number of the grains is too small compared to the thickness t of the piezoelectric layer, the Ag+ ions moving along the boundary of the grains connect the anode and the cathode to generate a short, thus causing the lack of the reliability, and if the number of the grains is too large compared to the thickness t of the piezoelectric layer, the reliability may be satisfied but the grain boundary length may disturb the mobility of the Ag+ ions, thus remarkably deteriorating the piezoelectric performance.

Therefore, it is preferred that the piezoelectric layer is configured to have the appropriate number of the grains on the vertical line H inside the piezoelectric layer 110 by adjusting the size of the grains based on the range of the major axis length Gmax of the largest grain of the grains on the arbitrary vertical line H within the range (15 μm to 100 μm) of the thickness t of the piezoelectric layer as in Table 2.

As described above, the multilayer piezoelectric element according to the present disclosure can satisfy the displacement characteristics and the reliability at the same time under the appropriate driving voltage in the portable devices by limiting the range of the thickness of the plurality of piezoelectric layers.

Further, the present disclosure can prevent the deterioration of the displacement characteristics by designing the thickness of the piezoelectric layer to secure the reliability through the adjustment of the number and size of the grains constituting the piezoelectric layer of the piezoelectric element.

And, the present disclosure can prevent the degradation of the overall piezoelectric performance by designing the thickness of the piezoelectric layer of the multilayer piezoelectric element to maintain the inactive layer including the internal electrodes having non-piezoelectric properties at less than about 12% compared to the entire thickness of the piezoelectric element.

The above-described exemplary embodiments of the present disclosure are disclosed for the purpose of exemplification and it will be appreciated by those skilled in the art that various substitutions, modifications and variations may be made in these embodiments without departing from the technical spirit of the present disclosure. Such substitutions and modifications are intended to be included in the appended claims.

What is claimed is:

1. A multilayer piezoelectric element comprising:
a plurality of piezoelectric layers; and
internal electrodes interposed between the plurality of piezoelectric layers and laminated to alternately form an anode and a cathode, wherein the piezoelectric layer has a thickness of 15 μm to 100 μm,
wherein a non-piezoelectric interfacial layer is formed on an interface between the plurality of piezoelectric layers and the internal electrodes.

2. The multilayer piezoelectric element according to claim 1, wherein a ratio of a sum of thicknesses of the internal electrodes to the entire thickness of the piezoelectric element is less than 12%.

3. The multilayer piezoelectric element according to claim 1, wherein the internal electrode and the non-piezoelectric interfacial layer are formed as an inactive layer.

4. The multilayer piezoelectric element according to claim 3, wherein a ratio of a thickness of the inactive layer to the entire thickness of the multilayer piezoelectric element is less than 12%, wherein a sum of the thicknesses of the internal electrodes and the non-piezoelectric interfacial layers is the thickness of the inactive layer.

5. The multilayer piezoelectric element according to claim 4, wherein when a ratio of the inactive layer is the ratio of the thickness of the inactive layer to the entire thickness of the multilayer piezoelectric element, the ratio of the inactive layer is determined by the following Equation:

Ratio of inactive layer=((thickness of internal electrode+thickness of non-piezoelectric interfacial layer)×number of layers)/entire thickness ($T$) of piezoelectric element.

6. The multilayer piezoelectric element according to claim 1, wherein the entire thickness of the multilayer piezoelectric element is between 100 μm to 1.5 mm.

7. The multilayer piezoelectric element according to claim 6, wherein the number of layers of the plurality of piezoelectric layers is 3 to 100.

8. The multilayer piezoelectric element according to claim 1, wherein a grain size of the piezoelectric layer is formed to have a charge moving path that satisfies 90% or more of relative displacement characteristics of the piezoelectric layer when compared to the displacement characteristics of a standard multilayer piezoelectric element with a piezoelectric layer thickness of 1 mm.

9. A multilayer piezoelectric element comprising:
a plurality of piezoelectric layers; and
internal electrodes interposed between the plurality of piezoelectric layers and laminated to alternately form an anode and a cathode, wherein the piezoelectric layer has a thickness of 15 μm to 100 μm, wherein a grain size of the piezoelectric layer satisfies the following Equation:

$$\frac{Gmax}{\sqrt{t}} \leq 0.51$$

where Gmax is a major axis length of the largest grain of the grains positioned on a vertical line H of a cross-section obtained by cutting the piezoelectric layer in a vertical direction, and t is the thickness of the piezoelectric layer.

10. The multilayer piezoelectric element according to claim 9, wherein the major axis length Gmax of the grain is 1 μm to 2 μm.

11. The multilayer piezoelectric element according to claim 9, wherein when the thickness of the piezoelectric layer is greater than 40 μm, the major axis length Gmax of the grain is 1 μm to 3 μm.

12. The multilayer piezoelectric element according to claim 9, wherein when the thickness of the piezoelectric layer is 60 μm to 100 μm, the major axis length Gmax of the grain is 1 μm to 4 μm.

13. A multilayer piezoelectric element comprising:
a plurality of piezoelectric layers; and
internal electrodes interposed between the plurality of piezoelectric layers and laminated to alternately form an anode and a cathode, wherein
the piezoelectric layer has a thickness of 15 μm to 100 μm, and wherein
relative displacement characteristics within the range of the thickness of the piezoelectric layer satisfy 95% or more compared to displacement characteristics of a standard multilayer piezoelectric element, and the relative displacement characteristics within the range of a grain size of the piezoelectric layer satisfy 90% or more compared to the displacement characteristics of the standard multilayer piezoelectric element, wherein
in the standard multilayer piezoelectric element, a thickness of a piezoelectric layer is 1 mm and a major axis length Gmax of a grain is 2 μm, and
wherein a non-piezoelectric interfacial layer is formed on an interface between the plurality of piezoelectric layers and the internal electrodes.

14. The multilayer piezoelectric element according to claim 13, wherein the grain size satisfies the following Equation:

$$\frac{Gmax}{\sqrt{t}} \leq 0.51$$

where Gmax is the major axis length of the largest grain of the grains positioned on a vertical line H of a cross-section obtained by cutting the piezoelectric layer in a vertical direction, and t is the thickness of the piezoelectric layer.

15. The multilayer piezoelectric element according to claim 13, wherein a ratio of a sum of thicknesses of the internal electrodes to the entire thickness of the piezoelectric element is less than 12%.

16. The multilayer piezoelectric element according to claim 13, wherein a sum of thicknesses of inactive layers, which is a sum of the thicknesses of the internal electrodes and thicknesses of the non-piezoelectric interfacial layers, to the entire thickness of the piezoelectric element is less than 12%.

17. The multilayer piezoelectric element according to claim 16, wherein when a ratio of the inactive layer is a ratio of the thickness of the inactive layer to the entire thickness of the multilayer piezoelectric element, the ratio of the inactive layer is determined by the following Equation:

Ratio of inactive layer=((thickness of internal electrode+thickness of non-piezoelectric interfacial layer)×number of layers) / entire thickness (T) of piezoelectric element.

18. The multilayer piezoelectric element according to claim 14, wherein the grain size is adjusted by the degree of grain refining of ceramic powder, which is a preparation material of the piezoelectric layer, and firing temperature and firing time of a ceramic sintered body using the ceramic powder.

19. The multilayer piezoelectric element according to claim 13, wherein the entire thickness of the multilayer piezoelectric element is 100 μm to 1.5 mm.

20. The multilayer piezoelectric element according to claim 13, wherein the number of layers of the plurality of piezoelectric layers is 3 to 100.

21. The multilayer piezoelectric element according to claim 13, wherein a major axis length Gmax of the largest grain of the grains constituting the piezoelectric layer is 1 μm to 2 μm.

22. A multilayer piezoelectric element comprising:
a plurality of piezoelectric layers; and
internal electrodes interposed between the plurality of piezoelectric layers and laminated to alternately form an anode and a cathode, wherein the internal electrodes comprise an Ag/Pd alloy, and
wherein the internal electrodes include a non-piezoelectric interfacial layer formed on opposing main surfaces of the internal electrodes.

23. The multilayer piezoelectric element according to claim 22, wherein the non-piezoelectric interfacial layer is a reaction product of the Ag/Pd alloy of the internal electrodes and ceramic material of the piezoelectric layer.

24. The multilayer piezoelectric element according to claim 23, wherein the non-piezoelectric interfacial layer comprises PdPbO, PdO, Ag/Pd-Pb, and Ag-PZT.

25. The multilayer piezoelectric element according to claim 22, wherein a grain size of the piezoelectric layer is formed to have a charge moving path that satisfies 95% or more of relative displacement characteristics of the piezoelectric layer when compared to the displacement characteristics of a standard multilayer piezoelectric element with a piezoelectric layer thickness of 1 mm.

26. The multilayer piezoelectric element according to claim 22, wherein a ratio of a sum of thicknesses of the internal electrodes to the entire thickness of the piezoelectric element ranges from 2% to less than 12%.

* * * * *